(12) United States Patent
Sugiyama et al.

(10) Patent No.: US 8,952,401 B2
(45) Date of Patent: Feb. 10, 2015

(54) SEMICONDUCTOR LIGHT EMITTING DEVICE, WAFER, AND METHOD FOR MANUFACTURING NITRIDE SEMICONDUCTOR CRYSTAL LAYER

(75) Inventors: Naoharu Sugiyama, Kanagawa-ken (JP); Taisuke Sato, Kanagawa-ken (JP); Hiroshi Ono, Kanagawa-ken (JP); Satoshi Mitsugi, Kanagawa-ken (JP); Tomonari Shioda, Kanagawa-ken (JP); Jongil Hwang, Kanagawa-ken (JP); Hung Hung, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/220,059

(22) Filed: Aug. 29, 2011

(65) Prior Publication Data

US 2012/0292649 A1    Nov. 22, 2012

(30) Foreign Application Priority Data

May 16, 2011 (JP) ................................. 2011-109784

(51) Int. Cl.
*H01L 33/00* (2010.01)
*H01L 21/02* (2006.01)
(Continued)

(52) U.S. Cl.
CPC .... *H01L 21/02494* (2013.01); *H01L 21/02381* (2013.01); *H01L 21/02458* (2013.01); *H01L 21/0254* (2013.01); *H01L 21/02576* (2013.01); *H01L 21/02631* (2013.01); *H01L 21/02639* (2013.01); *H01L 21/0265* (2013.01);

(Continued)

(58) Field of Classification Search
USPC .............. 257/94, 97, 103, E33.034, E33.016
See application file for complete search history.

(56) References Cited

U.S. PATENT DOCUMENTS 6,847,057 B1 * 1/2005 Gardner et al. .................. 257/99
7,985,979 B2 * 7/2011 David et al. ..................... 257/98
(Continued)

FOREIGN PATENT DOCUMENTS

JP            11-54798         2/1999
JP            2000-323417      11/2000
(Continued)

OTHER PUBLICATIONS

Pietzka et al., "Effect of Anodic Oxidation on the Characteristics of Lattice-Matched AlInN/GaN Heterostructures, "Journal of Electronic Materials, vol. 37, No. 5, 2008, pp. 616-623.*
(Continued)

*Primary Examiner* — Julia Slutsker
(74) *Attorney, Agent, or Firm* — Oblon, Spivak, McClelland, Maier & Neustadt, L.L.P.

(57) ABSTRACT

According to one embodiment, a semiconductor light emitting device includes a first semiconductor layer, a light emitting layer, a second semiconductor layer, and a low refractive index layer. The first semiconductor layer has a first major surface and a second major surface being opposite to the first major surface. The light emitting layer has an active layer provided on the second major surface. The second semiconductor layer is provided on the light emitting layer. The low refractive index layer covers partially the first major surface and has a refractive index lower than the refractive index of the first semiconductor layer.

15 Claims, 7 Drawing Sheets

(51) Int. Cl.
  *H01L 33/20* (2010.01)
  *H01L 33/44* (2010.01)
  *H01L 33/08* (2010.01)
  *H01L 33/40* (2010.01)
  *H01L 33/42* (2010.01)

(52) U.S. Cl.
  CPC .......... *H01L21/02664* (2013.01); *H01L 33/20* (2013.01); *H01L 33/44* (2013.01); *H01L 33/08* (2013.01); *H01L 33/405* (2013.01); *H01L 33/42* (2013.01)
  USPC ......... 257/94; 257/97; 257/103; 257/E33.034

(56) References Cited

U.S. PATENT DOCUMENTS

| | | | |
|---|---|---|---|
| 2004/0016936 A1* | 1/2004 | Tanaka et al. | 257/98 |
| 2006/0043400 A1* | 3/2006 | Erchak et al. | 257/98 |
| 2006/0118802 A1* | 6/2006 | Lee et al. | 257/98 |
| 2006/0163606 A1* | 7/2006 | Wierer et al. | 257/103 |
| 2007/0205407 A1* | 9/2007 | Matsuo et al. | 257/13 |
| 2009/0052159 A1 | 2/2009 | Abe et al. | |
| 2009/0159908 A1* | 6/2009 | David et al. | 257/95 |
| 2010/0117109 A1* | 5/2010 | Unno | 257/98 |
| 2011/0012154 A1* | 1/2011 | Okagawa et al. | 257/98 |

FOREIGN PATENT DOCUMENTS

| | | |
|---|---|---|
| JP | 2006-196543 A | 7/2006 |
| JP | 2007-227938 A | 9/2007 |
| JP | 2008-235684 A | 10/2008 |
| JP | 2009-70991 | 4/2009 |
| JP | 2010-278237 | 12/2010 |
| JP | 2011-60917 | 3/2011 |
| WO | WO 2011/024943 A1 | 3/2011 |

OTHER PUBLICATIONS

Yaghdjian et al., "AlN surface modification by UV laser radiation", Proc. SPIE 3404, ALT'97 International Conference on Laser Surface Processing, 215, May 26, 1998.*

Brunner et al., "Optical constants of epitaxial AlGaN films and their temperature dependence," J. Appl. Phys., 82, 5090, 1997.*

Japanese Office Action issued Apr. 16, 2012, in Patent Application No. 2011-109784 (with English-language translation).

Office Action issued Nov. 22, 2011, in Japanese Patent Application No. 2011-109784 (with English-language translation).

Office Action issued May 30, 2013 in Japanese Patent Application No. 2012-009159 with English language translation.

Office Action issued May 30, 2013 in Japanese Patent Application No. 2012-009160 with English language translation.

* cited by examiner

SEMICONDUCTOR LIGHT EMITTING DEVICE, WAFER, AND METHOD FOR MANUFACTURING NITRIDE SEMICONDUCTOR CRYSTAL LAYER

CROSS-REFERENCE TO RELATED APPLICATIONS

This application is based upon and claims the benefit of priority from the prior Japanese Patent Application No. 2011-109784, filed on May 16, 2011; the entire contents of which are incorporated herein by reference.

FIELD

Embodiments described herein relate generally to a semiconductor light emitting device, a wafer, and a method for manufacturing nitride semiconductor crystal layer.

BACKGROUND

The compound semiconductor is used in various fields such as a high-speed electronic device represented by a high frequency device and an optical device represented by a light emitting/light receiving device, and high-performance devices have been developed for practical use.

However, when a difference between the refractive index of a crystal layer forming a light extraction face and the refractive index of the air is large, it is not possible to extract light efficiently. Furthermore, even when the surface of the light extraction plane is subjected to surface roughening, poor reproducibility of the roughness causes device characteristics to be non-uniform among devices. Improvement of the light extraction efficiency is desired in the semiconductor light emitting device.

DETAILED DESCRIPTION

In general, according to one embodiment, a semiconductor light emitting device includes a first semiconductor layer, a light emitting layer, a second semiconductor layer, and a low refractive index layer. The first semiconductor layer has a first major surface and a second major surface being opposite to the first major surface. The light emitting layer has an active layer provided on the second major surface. The second semiconductor layer is provided on the light emitting layer. The low refractive index layer covers partially the first major surface and has a refractive index lower than the refractive index of the first semiconductor layer.

Hereinafter, embodiments will be explained with reference to the drawings. A similar component is denoted by the same reference numeral and detailed explanation will be optionally omitted in each of the drawings.

Figure 1:
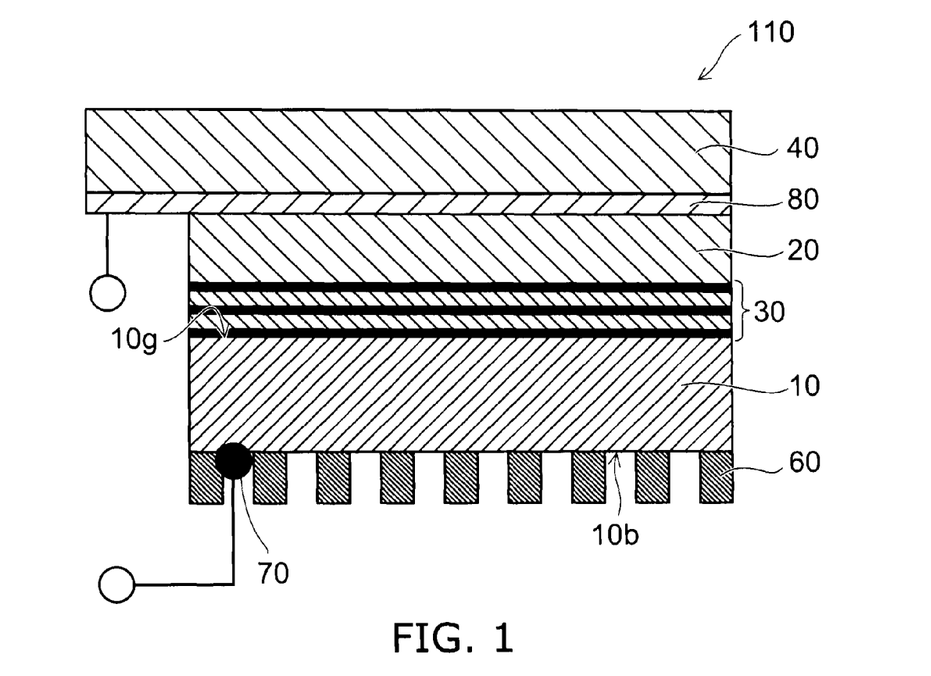
FIG. 1 is a schematic cross-sectional view showing a semiconductor light emitting device according to an embodiment.

FIG. 1 is a schematic cross-sectional view showing a semiconductor light emitting device according to an embodiment.

The semiconductor light emitting device 110 according to the embodiment is provided with an n-type layer (first semiconductor layer) 10, a p-type layer (second semiconductor layer) 20, an MQW (Multiple Quantum Well) active layer (light emitting layer) 30, a support substrate 40, a protrusion part (low refractive index layer) 60, and a reflection metal 80. Then, in the semiconductor light emitting device 110 according to the embodiment, the support substrate 40 of a Si substrate is bonded to an LED (Light Emitting Diode) stacked structure of the p-type layer 20, the MQW active layer 30, and the n-type layer 10 on the p-type layer 20 side thereof via the reflection metal 80. The reflection metal 80 works also as an electrode film.

The first semiconductor layer 10 has a first conductivity type. The second semiconductor layer 20 has a second conductivity type. That is, the second semiconductor layer 20 has a conductivity type different from the conductivity type of the first semiconductor layer 10. In the embodiment, the first conductivity type is an n-type and the second conductivity type is a p-type.

The n-type layer 10 side forms a light extraction face (a first major surface) 10b.

That is, the first semiconductor layer 10 has a first major surface (the light extraction face 10b) and a second major surface 10g, which is opposite to the first major surface 10b. The light emitting layer 30 is provided on the second major surface 10g. The second semiconductor layer 20 is provided on the light emitting layer 30. The low refractive index layer 60 covers partially the first major surface 10b.

An n-type GaN layer, for example, is used as the n-type layer 10. A p-type GaN layer, for example, is used as the p-type layer 20. The protrusion part 60 having a protruding shape is formed on a flat surface of the n-type layer 10 (light extraction face 10b). The protrusion part 60 includes AlN, for example. In this case, while the refractive index of the GaN is approximately 2.5, the refractive index of the AlN is approximately 2.1. Furthermore, AlGaN, which is one of the mixed crystal series of Al and Ga, has a medium refractive index therebetween, and the AlGaN has a refractive index smaller than the GaN and is effective as a material of the protrusion part. Furthermore, for preventing unintended light reflection or scattering between the first semiconductor layer 10 having a high refractive index and the low refractive index material, an intermediate layer preferably does not exist at a boundary surface therebetween. Moreover, if possible, preferably both of the materials are crystalline and have a continuous lattice at the boundary. In the embodiment, the protrusion part 60 has a shape of an equilateral hexagonal pillar having a side length of 300 nm and a height of 500 nm when viewed in the direction perpendicular to the light extraction face 10b. Furthermore, as shown in FIG. 1, the plural protrusion parts 60 are formed on the light extraction face 10b and arranged having a spacing of 1 μm from each other. The shape of the protrusion part 60 may not be always an equilateral hexagonal pillar but may be a pyramid shape having a bottom plane of a triangle, a quadrangle, a polygon, a circle, or the like.

Figure 2:
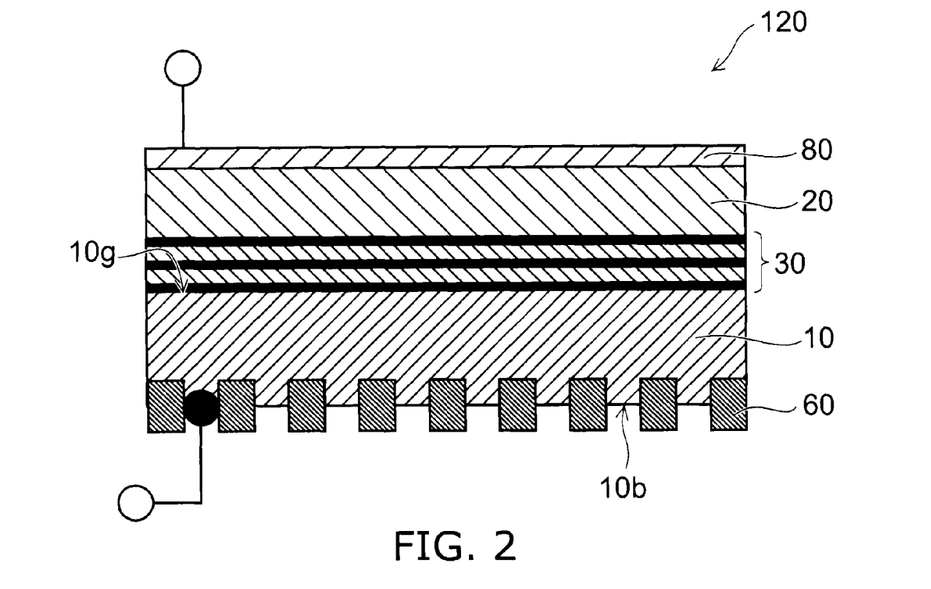
FIG. 2 is a schematic cross-sectional view showing a semiconductor light emitting device according to another embodiment.

FIG. 2 is a schematic cross-sectional view showing a semiconductor light emitting device according to another embodiment.

Figure 3:
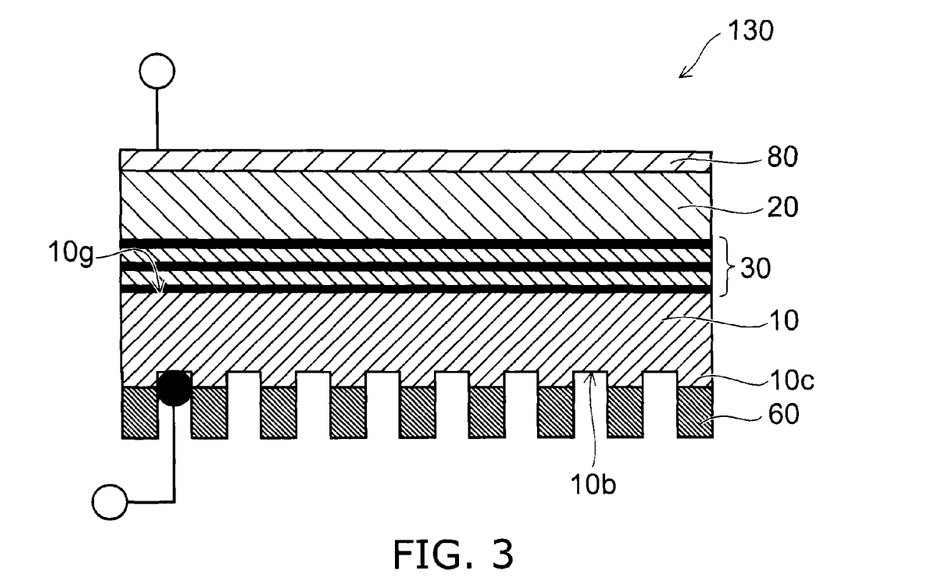
FIG. 3 is a schematic cross-sectional view showing a semiconductor light emitting device according to still another embodiment.

FIG. 3 is a schematic cross-sectional view showing a semiconductor light emitting device according to still another embodiment.

Figure 4:
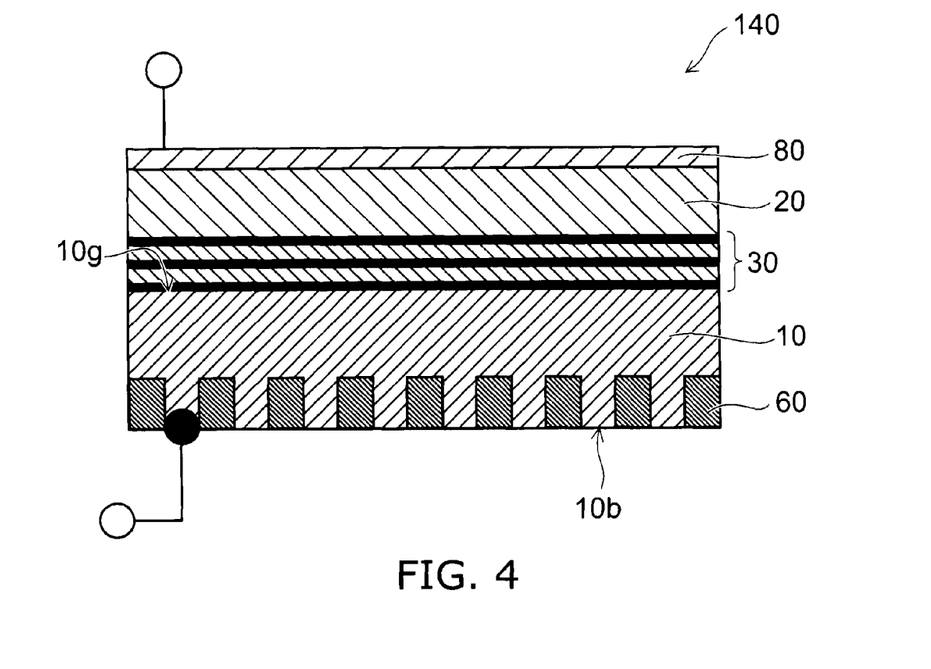
FIG. 4 is a schematic cross-sectional view showing a semiconductor light emitting device according to yet still another embodiment.

FIG. 4 is a schematic cross-sectional view showing a semiconductor light emitting device according to yet still another embodiment.

Figure 5:
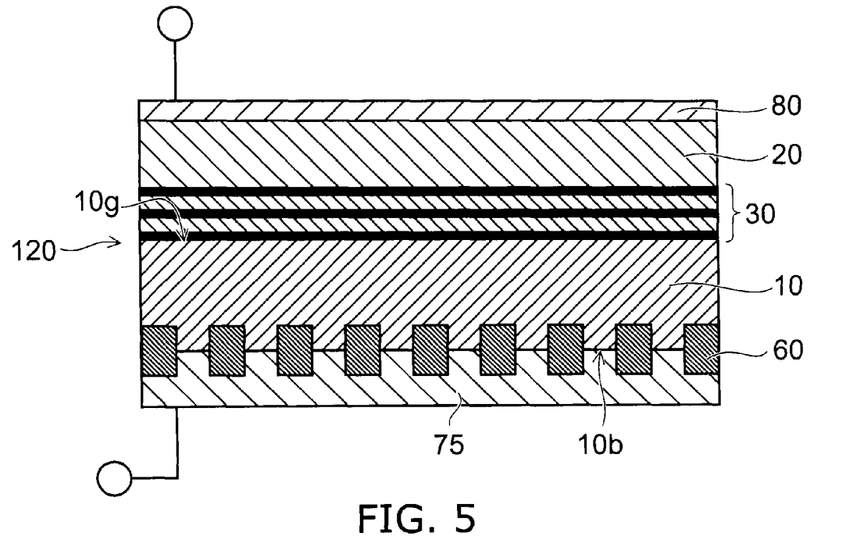
FIG. 5 is a schematic cross-sectional view showing a state of providing a transparent conductive film on the semiconductor light emitting device shown in FIG. 2.

FIG. 5 is a schematic cross-sectional view showing a state of providing a transparent conductive film on the semiconductor light emitting device shown in FIG. 2.

Figure 6:
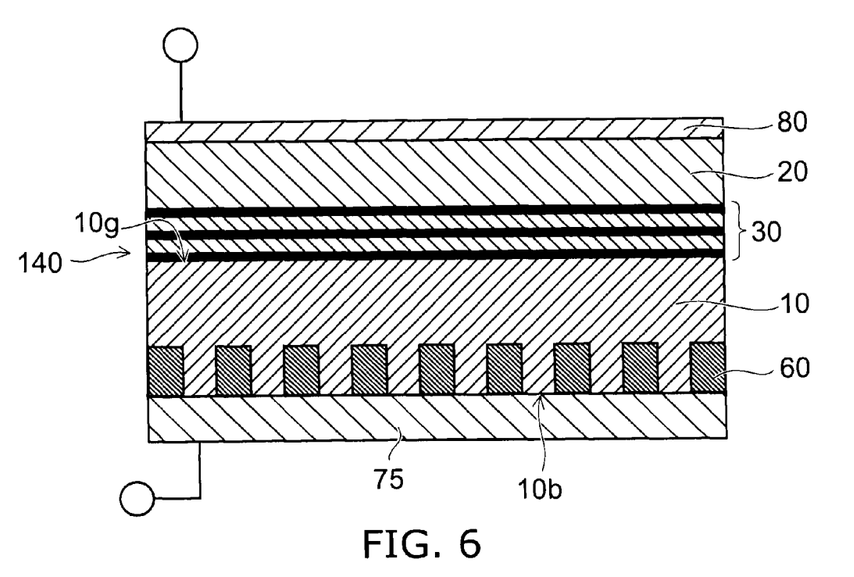
FIG. 6 is a schematic cross-sectional view showing a state of providing a transparent conductive film on the semiconductor light emitting device shown in FIG. 4.

FIG. 6 is a schematic cross-sectional view showing a state of providing a transparent conductive film on the semiconductor light emitting device shown in FIG. 4.

The support substrate 40 shown in FIG. 1 is omitted from the semiconductor devices shown in FIGS. 2 to 6.

While, in the semiconductor light emitting device 110 shown in FIG. 1, an example is shown for the case where the protrusion part 60 is formed on the flat surface of the n-type layer 10 in a protruding shape, a part of the protrusion part 60 may be embedded in the n-type layer 10 as in the semiconductor light emitting device 120 shown in FIG. 2. Alternatively, the surface of the n-type layer 10 (light extraction face 10b) is rough and the protrusion part 60 may be formed on a convex part 10c as in the semiconductor light emitting device 130 shown in FIG. 3. Alternatively, the protrusion part 60 may be embedded perfectly in the n-type layer 10 and the surface (light extraction face 10b) may be flattened as shown in FIG. 4.

From the standpoint of light extraction efficiency, the shape in which the protrusion part 60 is protruding as in FIGS. 1 and 3 has an advantage.

In contrast, when a transparent conductive film 75 represented by indium tin oxide (ITO) is stacked for an n-side electrode on the rough surface (light extraction face 10b including the protrusion part 60) as shown in FIG. 5 and FIG. 6, each of the semiconductor light emitting device 120 shown in FIG. 2 and the semiconductor light emitting device 140 shown in FIG. 4 has an advantage. This is because typically the thickness of the stacked ITO layer (transparent conductive film) 75 is approximately 200 nm and a problem such as disconnection of the transparent conductive film 75 at a step does not happen when the surface roughness is equivalent or smaller than the ITO thickness.

In each of the semiconductor light emitting devices shown in FIGS. 1 to 6, the protrusion part 60 is formed by material having a refractive index smaller than the refractive index of the n-type layer 10. As described above, AlN is used in the protrusion part 60, for example. Furthermore, an n-type GaN layer is used as the n-type layer 10, for example.

Here, a reference example will be explained. For example, in a light emitting device made of nitride semiconductor, a gallium nitride crystal layer having a surface of a (0001) plane is formed on a sapphire substrate having a surface of the same (0001) plane and furthermore an active layer of an InGaN thin film crystal layer is combined therewith to form a preferable light emitting diode or the like having a high light emitting efficiency.

The light emitting diode stacking the nitride semiconductor crystal layer on the sapphire substrate uses a structure in which an n-type layer, a quantum well type light emitting layer, a p-type GaN layer are stacked on the sapphire substrate. Because the sapphire substrate is almost transparent for a wavelength band of a blue region which is a target wavelength band of this purpose, the light emitting diode frequently employs a structure in which a reflection film is formed on the rear side of the sapphire substrate and light is extracted from the upper part of the p-type GaN layer on the surface side (face-up structure). In this case, the light emitting diode is designed so as to suppress light leakage to the substrate rear side and to extract more light from the crystal layer surface (p-electrode side) by bonding the reflection metal film on the sapphire substrate on the rear side. In this case, sometimes light does not reach the reflection layer by scattering in a small angle and is absorbed in the substrate because of a refractive index difference between the GaN crystal layer and the sapphire substrate. For preventing this problem, the light emitting diode is designed so as to guide the light from the GaN layer efficiently to the reflection film and to return the light to the GaN layer by providing the sapphire substrate surface with surface roughening of approximately 1 μm and stacking a GaN crystal layer thereon.

Meanwhile, in another reference example, it is important how to deal with heat generation under an operation condition of higher current injection aiming for a higher light output. For this purpose, there is an example employing a structure (thin film structure) in which, after an LED structure made of nitride semiconductor is epitaxially grown on a sapphire substrate, the surface side thereof composed of a p-type GaN layer is bonded onto a support substrate having a high thermal conductivity and the sapphire substrate is removed therefrom. In this case, an end surface of an n-type GaN layer from which the sapphire substrate is removed is exposed to be sometimes used as a light extraction face and also a contact surface. At this time, when the surface of the GaN crystal layer, which is the light extraction face, is flat, light is totally reflected because of the refractive index difference from the air and the light cannot be extracted efficiently. Accordingly, the method to prepare the surface of the GaN layer, which is the light extraction face, with surface roughening by etching using KOH or the like is employed.

While the thin-film type device structure realizes improvement of the light extraction efficiency with surface roughening by a method such as the etching of the light extraction face, sufficient reproducibility is not obtained in the wet etching represented by the KOH etching and the sometimes device characteristics are not uniform thereamong.

In contrast, in the semiconductor light emitting device according to the embodiment, the protrusion part 60 is formed by material having a refractive index smaller than the refractive index of the n-type layer 10 and covers the light extraction face 10b partially. Therefore, the rough surface of the protrusion part 60 enables the light extraction efficiency to be improved. Furthermore, a step height in the rough surface can be made small compared with the reference example by employing the low reflection index material for the protrusion part 60. Furthermore, resistance in the vertical direction (film thickness direction) can be reduced compared with a case in which the protrusion parts 60 cover the whole light extraction face 10b.

Next, an example of a process for manufacturing such a semiconductor light emitting device structure will be explained.

Figure 7A:
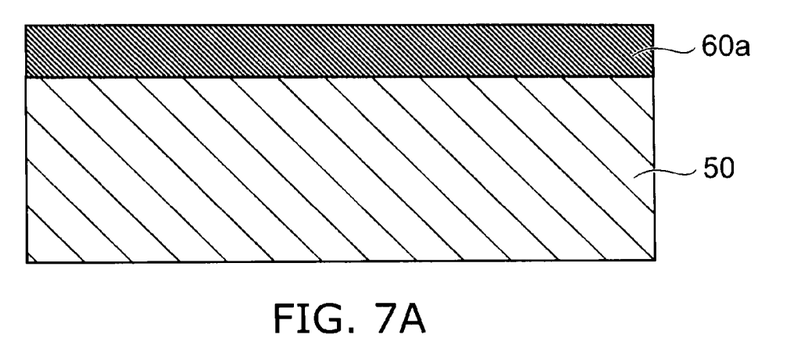
FIGS. 7A to 7C are schematic cross-sectional views illustrating a manufacturing method of a wafer and a nitride semiconductor crystal layer according to an embodiment.
Figure 7B:
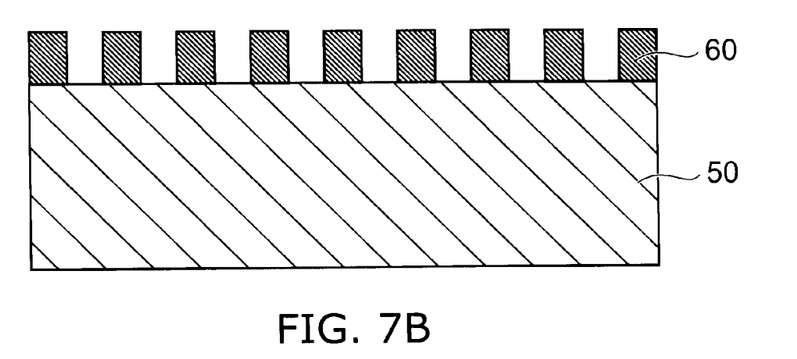
Figure 7C:
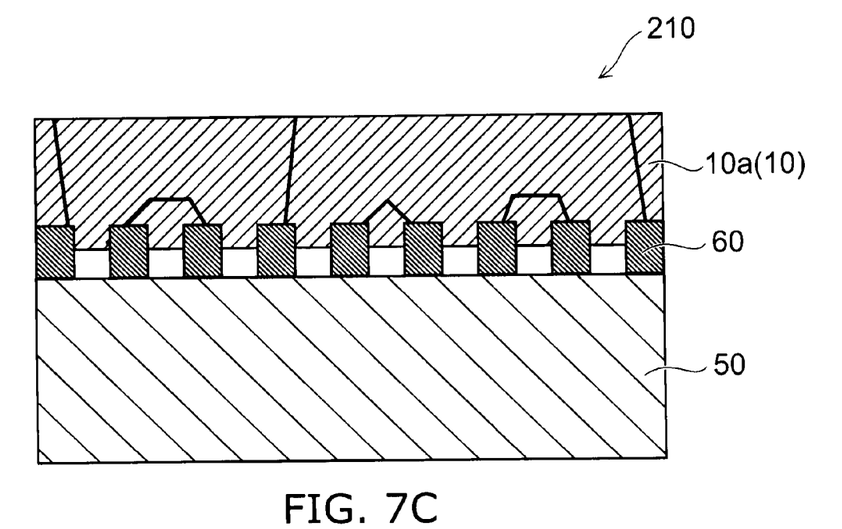

FIGS. 7A to 7C are schematic cross-sectional views illustrating a manufacturing method of a wafer and a nitride semiconductor crystal layer according to an embodiment.

FIGS. 8A to 8F are schematic cross-sectional views illustrating another manufacturing method of a wafer and a nitride semiconductor crystal layer according to an embodiment.

A silicon substrate (crystal substrate) 50 having a surface of a (111) orientation is prepared as a substrate for crystal growth of a thin film nitride semiconductor. The substrate for crystal growth of a thin film nitride semiconductor is not limited to the silicon substrate and may be a sapphire substrate. While, the thickness of the silicon substrate 50 is approximately 525 μm, for example, in the embodiment, there is not a problem when the thickness is selected optionally in a range approximately between 250 μm and 800 μm, for example.

Generally, the surface of the Si (silicon) substrate preserved in the air is covered by a native oxide film. Accordingly, for removing this native oxide film and providing hydrogen termination processing for a substrate surface, the thin film growth substrate (silicon substrate 50) is subjected to processing of dilute hydrofluoric acid having a concentration of approximately 1% for approximately 1 minute after cleaning by acid treatment. By this processing, the surface of the silicon crystal layer (silicon substrate 50) comes to have a surface structure terminated by hydrogen and a water repellent surface.

Subsequently, as shown in FIG. 7A, the silicon substrate 50 having a hydrogen-terminated surface is introduced into a film deposition apparatus and an AlN layer 60a having a thickness of 500 nm is stacked thereon. An ECR plasma sputter apparatus is used for the AlN film deposition and an aluminum target is sputtered by plasma discharge performed under a mixed atmosphere of Ar gas and nitrogen gas, and thus the 500 nm AlN film can be stacked approximately in 30 minutes. While the film deposition temperature is set to 500° C. in the embodiment, the film deposition temperature can be selected optionally in a range from 100° C. to 800° C., for example. While the ECR plasma sputter apparatus is used for the film deposition of the AlN layer 60a in the embodiment, the film deposition method can be optionally selected and an MOCVD (gas phase growth method using organic metal) apparatus, a molecular beam epitaxy method (MBE) apparatus, or the like may be used.

While a hydrogen atom terminating the surface of the Si substrate is kept at a state combined with Si atom up to the temperature from 500° C. to 600° C., the hydrogen atom terminating the surface of the Si substrate displaces Al atom or nitrogen atom and does desorption when the AlN layer is formed at 500° C. by an ECR plasma sputter film deposition method, and thus does not remain at boundary surface of AlN/Si. Furthermore, when the AlN layer is formed at a higher temperature, the AlN crystal layer is stacked after a hydrogen atom does thermal desorption and dangling-bond appears on surface of Si.

Furthermore, when the surface of the Si substrate is used without providing hydrogen termination processing, a native oxide film is formed during handling in the air. This native oxide film stably-kept up to a high temperature and is impeditive in the epitaxial film deposition of the AlN crystal layer. Therefore, an annealing treatment is necessary at the temperature approximately from 900° C. to 1000° C. in vacuum or under an inert atmosphere before a film deposition process.

Subsequently, as shown in FIG. 7B, the substrate in which the 500 nm AlN layer 60a has been stacked on the silicon substrate 50 is taken out of the film deposition apparatus and subjected to surface processing by a photolithography process. Specifically, the AlN layer 60a is left in a hexagonal pillar shape having a side length of 300 nm and the area therearound is etched off. The hexagonal pillar shapes of the AlN (first crystal layer) are arranged having a spacing of 1 μm therebetween. The surface of the silicon substrate 50 is exposed in the part except the part where hexagonal-pillar-shaped AlN remains. That is, the hexagonal-pillar-shaped AlN corresponds to the protrusion part 60 described above in FIG. 1.

Subsequently, as shown in FIG. 7C, the substrate subjected to the etching processing of the AlN layer 60a, after having been cleaned again by acid treatment, is introduced into an MOCVD (gas phase growth method using organic metal) apparatus, and the substrate temperature is increased to 1,100° C. and a gallium nitride layer (second crystal layer) 10a having a thickness of 2 μm is formed by the use of TMG (Tri-Methyl-Gallium) and $NH_3$ (ammonia) as source materials. That is, the gallium nitride (GaN) layer 10a corresponds to the n-type layer 10 described above in FIG. 1, for example. In this manner, the first crystal layer (AlN in the embodiment) made of nitride containing Al is formed so as to partially cover the major surface of the silicon substrate 50 and the second crystal layer (GaN in the embodiment) made of nitride containing Al in a content rate lower than that in the first crystal layer is grown on the first crystal layer, and thus a wafer 210 according to the embodiment is formed.

At this time, silicon (Si) is added in the GaN layer 10a in a concentration of $1 \times 10^{19}$ (atoms·cm$^{-3}$) as an impurity. Here, the n-type GaN layer may not be formed directly on the substrate having the rough surface of AlN (protrusion part 60), but the n-type GaN layer may be stacked after a GaN layer without including impurities is grown approximately in a thickness of approximately 1 to 3 μm. In a structure in which the GaN layer without including impurities is grown first, it is difficult to obtain contact from the light extraction face 10b and processing for forming a contact electrode is performed as described below.

Here, as a result of a study by the inventors, the following has been made clear for the case where the GaN layer 10a is epitaxially grown at high temperature on the substrate in which a part of the silicon substrate 50 is covered by the AlN (protrusion part 60) as in the embodiment. The probability of adsorption and decomposition of the source material is different between on the AlN and on the Si crystal surface. At high temperature, growth of the GaN thin film crystal is accelerated more on the AlN layer than on the Si crystal surface. Furthermore, the GaN layer 10a growing on the AlN part having the protruding shape grows not only in a <111> axis direction (direction perpendicular to the substrate surface) but also in a lateral direction. Accordingly, the GaN layer 10a on the AlN part is soon combined with the GaN layer 10a having started to grow from the neighboring AlN protrusion and covers the substrate surface together as a film. Furthermore, it is possible to further increase the selectivity of the crystal growth on the AlN when a silicon nitride (SiN) layer is formed on the Si crystal surface by a process such as one in which ammonia to be used as a source material is introduced in advance to the TMG before the crystal growth of the GaN layer.

As described above, by temperature adjustment of the gas atmosphere in the film deposition, GaN layer 10a is not formed on the silicon substrate 50 but the GaN layer 10a is formed starting from the AlN protrusion part 60. Accordingly, after the GaN layer 10a has been formed finally as an integrated film, a region between the protrusion parts 60 remains as a vacant space. At this time, it can be adjusted by a growth condition whether the GaN crystal layer becomes flat against the top surface of the protrusion part 60 or the GaN film sinks to a level lower than the top surface of the protrusion part 60.

In this manner, when the vacant space exist between the AlN protrusion parts 60, the dislocation density of the GaN layer 10a on the vacant space can be reduced. Therefore, the crystal quality of the GaN layer 10a is improved in this part. Furthermore, since the vacant space exists between the AlN protrusion parts 60, it is possible to absorb or reduce shrinkage caused by thermal expansion coefficient difference in a temperature cooling process after the formation of the GaN layer 10a. Therefore, it is possible to suppress bowing caused in the two-layer structure of the silicon substrate 50 and the GaN layer 10a and to prevent a crack accompanying the bowing from occurring.

Subsequently, after the growth of the n-type GaN layer, the light emitting layer 30 (refer to FIG. 1) composed of a multilayer film of InGaN and GaN is stacked on this n-type gallium nitride crystal layer (n-type layer 10). Furthermore, for current injection to emit light in the light emitting layer 30, the upper side of the crystal structure is subjected to p-type (Mg) doping. While, in the embodiment, the gas phase growth method using organic metal (MOCVD method) is proposed as a thin film crystal growth method of the n-type GaN crystal layer (n-type layer 10), the light emitting layer 30, and the p-type layer 20, it is optional to use any of a molecular beam epitaxy (MBE) method, an HVP (Hydride Vapor Phase Epitaxy) method, and the like, which are used in the crystal growth of a nitride semiconductor.

Furthermore, after the thin film crystal of the LED structure has been epitaxially grown in this manner, a metal film including Ag (reflection metal 80, refer to FIG. 1), for example, a silver nickel layer is stacked on the surface of the p-type layer 20 as a reflection film and a contact layer. After that, the surface of the p-type layer 20 is bonded to the support substrate 40 (refer to FIG. 1) made of material such as silicon, cupper, or the like. Next, the silicon substrate 50 of the thin film crystal growth substrate is removed. After the support substrate 40 has been bonded to the p-type layer 20, the growth substrate (silicon substrate) 50 can be removed by polishing of the growth silicon substrate 50. At this time, after the silicon substrate 50 has been almost removed by the polishing, the slightly remaining Si is finally removed by dry etching using SF6 gas as an etchant, and thus the AlN protrusion part 60 and the GaN layer 10a, which have been formed first on the silicon substrate 50, can be exposed on the surface.

Finally, a fine wire electrode 70 (refer to FIG. 1) is formed on the n-type GaN layer (n-type layer 10) which is exposed between the AlN protrusion parts 60 and further a p-type electrode is formed on the reflection metal 80, and then the LED is completed. At this time, as described above, the n-type contact cannot be obtained on the surface where the silicon substrate 50 for the nitride thin film growth has been removed, when the GaN crystal layer without including impurities is grown first in the growth of the GaN thin film crystal layer on the Si substrate having the AlN protrusion structure. Accordingly, the n-type contact is formed after the GaN layer without including impurities has been etched off and the n-type GaN layer has been exposed on the surface.

Figure 8A:
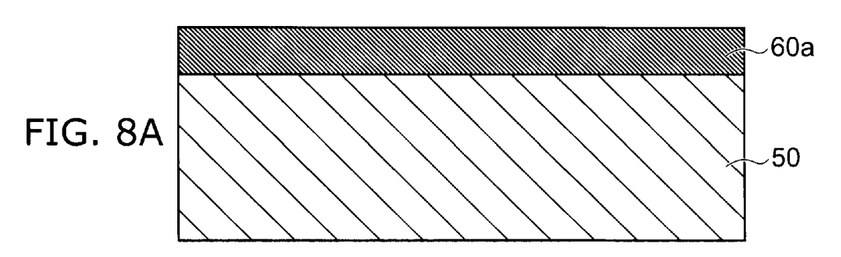
FIGS. 8A to 8F are schematic cross-sectional views illustrating another manufacturing method of a wafer and a nitride semiconductor crystal layer according to an embodiment.
Figure 8B:
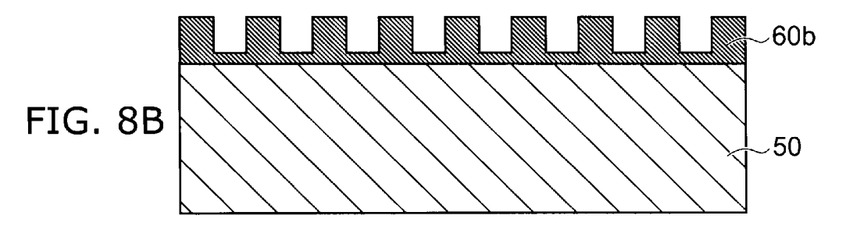

In the manufacturing method of the nitride semiconductor crystal layer which has been explained with reference to FIGS. 7A to 7C, while the AlN layer 60a is etched until the surface of the silicon substrate 50 is partially exposed in the process shown in FIG. 7B, the manufacturing method is not limited to this example. As another manufacturing method according to the embodiment, the etching of the AlN layer 60a may be terminated before the surface of the silicon substrate 50 is partially exposed. FIGS. 8A to 8F show a process example of another manufacturing method. First, as shown in FIG. 8A, the AlN layer 60a is formed on the silicon substrate 50. At this time, the thickness of the AlN layer 60a is set to 800 nm. The thickness of the AlN layer 60a may be any one in a range approximately between 300 nm and 2 µm. Subsequently, as shown in FIG. 8B, the AlN layer 60a is subjected to the surface roughening according to a sequence of the photography. At this time, the shape of a convex part of the AlN layer 60b subjected to the surface roughening includes a pillar shape or a pyramid shape having a bottom plane of a triangle, a quadrangle, a polygon, a circle, or the like, as described above.

Figure 8C:
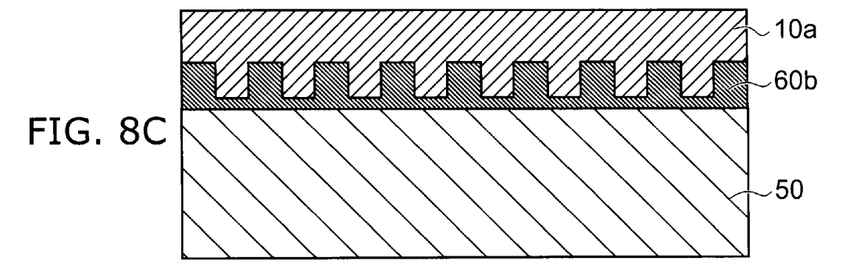
Figure 8D:
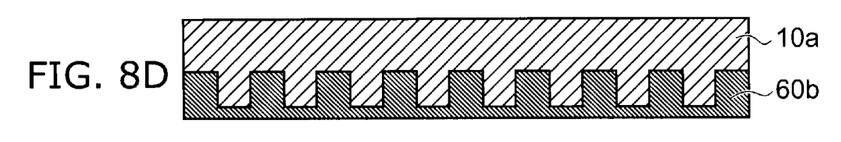
Figure 8E:
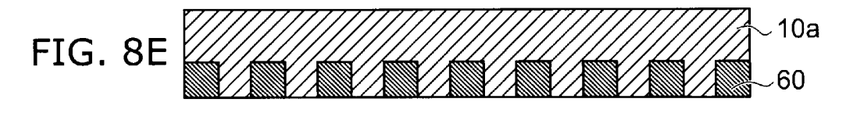
Figure 8F:
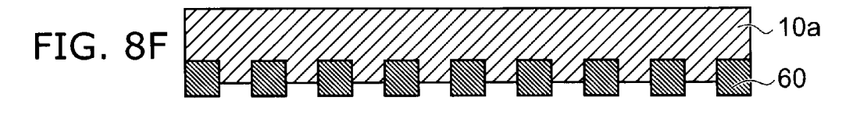

Then, as described above, the GaN layer 10a is grown on the AlN layer 60b having the rough surface (FIG. 8C). In this case, while the AlN layer 60a grows so as to cover concaves of the AlN layer 60b, a lot of facet surfaces are exposed at an early stage in growth covering such concaves. The behavior of dislocation is modulated in these facet surfaces and the dislocation disappears by the interaction between the dislocations. Therefore, it is known that growth on concave-convex surface has an effect on reducing the dislocation density. Furthermore, the light emitting layer 30, the p-type layer 20, and the reflection metal 80 are formed (not shown in the drawing), and the silicon substrate 50 is removed after the support substrate 40 has been bonded (not shown in the drawing). At this time, the etching of the Si substrate 50 is terminated when the AlN layer 60b is exposed on the whole surface and before the surface of the GaN layer 10a is exposed partially, and thus the AlN layer 60b covers the whole surface (FIG. 8D). After that, the AlN layer 60 is etched slightly after the removal of the silicon substrate 50 and then the GaN part (or protrusion part 60) can be exposed in a part of the surface (FIG. 8E). When the etching is continued further, the rough surface can be formed on the surface by the etching selectivity of the AlN and the GaN (FIG. 8F).

By another manufacturing method according to the embodiment, it is possible to control the behavior of dislocation in the GaN layer 10a comparatively easily. In another manufacturing method according to the embodiment, AlN may be formed in a thin film after the AlN layer 60a has been etched until the surface of the silicon substrate 50 is exposed partially and the rough surface may be formed in the AlN layer 60a. For example, after the AlN protrusions have been formed on the silicon substrate partially covering the surface, AlN layer having a thickness of approximately 20 to 200 nm is grown first by the MOCVD apparatus and the whole silicon surface is covered by the AlN layer. The process after that is the same as the process described above. In this case as well, since a GaN layer grows on concave-convex surface of a AlN layer, an effect on reducing the dislocation density is the same as the explanation described above.

Next, another embodiment will be explained.

Figure 9A:
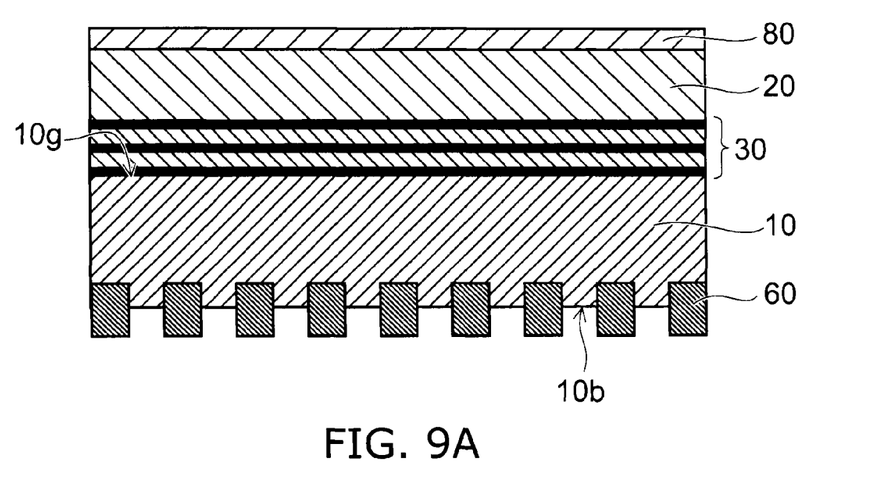
FIGS. 9A and 9B are schematic cross-sectional views explaining a semiconductor light emitting device according to still another embodiment.
Figure 9B:
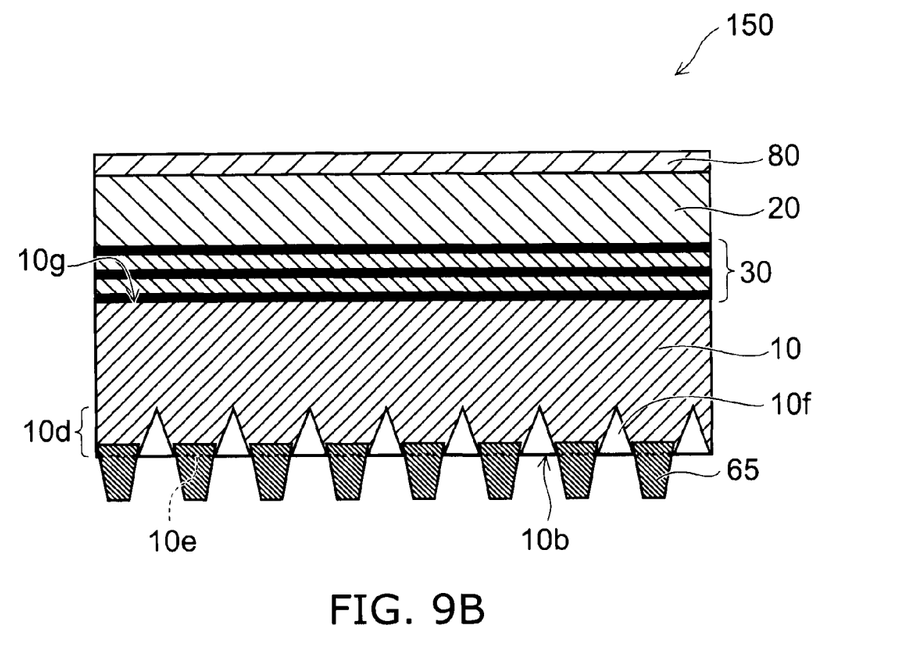

FIGS. 9A and 9B are schematic cross-sectional views explaining a semiconductor light emitting device according to still another embodiment.

As shown in FIG. 9B, the semiconductor light emitting device 150 according to the embodiment uses an LED structure of a p-type layer (second semiconductor layer) 20, an MQW active layer (light emitting layer) 30, and an n-type layer (first semiconductor layer) 10. The n-type layer 10 is made of an n-type gallium nitride crystal having a thickness of 3 µm, and the surface of this n-type GaN (light extraction face 10b) is subjected to surface roughening of 1 µm. A part 10e on a convex part of this concave-convex part 10d is formed by AlN. While this structure is similar to the structure shown in FIG. 2, a concave part 10f is formed deeply on the GaN layer side and the AlN protrusion part 65 after etching has a shape closer to a pyramid than to a pillar. In this manner, the deeper trench has an advantage from the standpoint of light extraction efficiency.

The above described surface roughening can be performed by removing Si from GaN crystal layer (GaN layer 10a) from the silicon crystal (silicon substrate 50) of a growth substrate, exposing the AlN protrusion part 60 before etching and the GaN layer 10a which have been formed first on the silicon substrate 50, and then further providing dry etching using Cl series gas.

Specifically, as shown in FIG. 9A, the etching has selectivity for GaN and AlN when the surface having the AlN protrusion part 60 structure formed on the GaN surface (n-type layer 10) is subjected to dry etching using the Cl series gas. Accordingly, while the AlN protrusion part 60 is etched at the edge part of the top surface thereof, the whole protrusion is not removed. In contrast, the etching proceeds deeply in the GaN layer exposed as the under layer, and thus a rough surface enlarged with deeper trench can be obtained as shown in FIG. 9B.

Figure 10A:
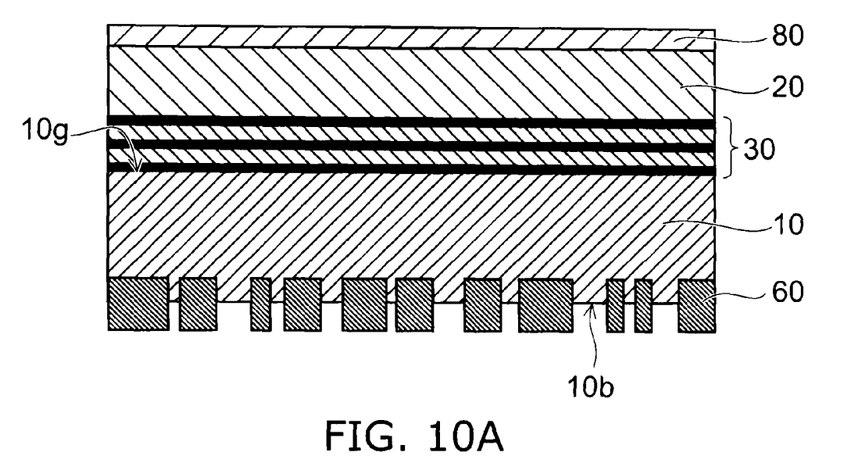
FIGS. 10A and 10B are schematic cross-sectional views explaining a semiconductor light emitting device according to yet still another embodiment.
Figure 10B:
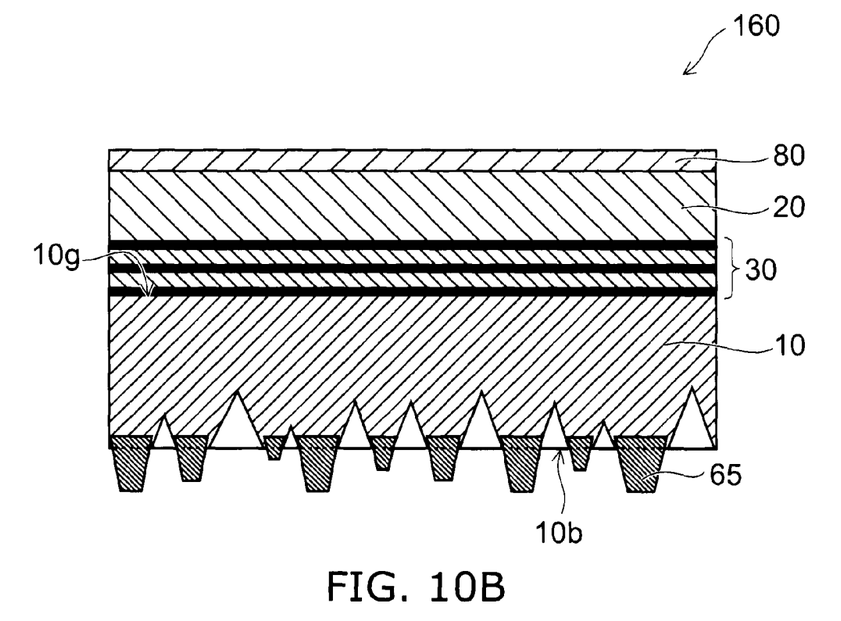

FIGS. 10A and 10B are schematic cross-sectional views explaining a semiconductor light emitting device according to yet still another embodiment.

As shown in FIG. 10B, in the semiconductor light emitting device 160 according to the embodiment, the AlN protrusion parts 60 before etching are arranged at random in the size (lateral width) thereof and the spacing therebetween. Therefore, it is possible to provide further randomness through the rough surface after dry etching.

That is, as shown in FIGS. 10A and 10B, the AlN protrusion part 60 having a small width is caused to shrink also in the height direction because the etching proceeds from the edge part of the top surface in the AlN protrusion part 60. In contrast, in the protrusion part 60 having a large width, the etching proceeds slowly in the height direction and thus difference is enlarged in the height among the AlN protrusion parts 65 after the etching. In addition, while the etching proceeds deeply in the GaN layer (n-type layer 10) in a part having a large spacing between the AlN protrusion parts 60, the etching does not proceed deeply in the GaN layer in a part having a small spacing. By such a mechanism, as shown in FIG. 10B, it is possible to manufacture a shape having the AlN protrusion part 65 on the top of the rough surface and also having a rough surface in which randomness is more strongly enhanced. In the embodiment, the depth variation (height difference) of the roughness is within a range of approximately 600 nm to 1.5 µm. The light extraction efficiency is improved in such a shape having a high randomness in the roughness.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements incorporated unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, the embodiments of the invention have been explained with reference to the specific examples. However, the invention is not limited to these specific examples. For example, one skilled in the art may similarly practice the invention by appropriately selecting a specific configuration of each component such as the substrate, the low refractive index layer, the active layer, and the semiconductor layers included in the semiconductor light emitting device and the wafer from known art. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, any manufacturing method of the semiconductor light emitting device, the wafer, and the nitride semiconductor crystal layer which one skilled in the art can practice by appropriate design modification based on the manufacturing method of the semiconductor light emitting device, wafer, and the nitride semiconductor crystal layer which is described above as the embodiment of the invention is also included in the scope of the invention to the extent that the purport of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
a first semiconductor layer having a first major surface and a second major surface opposite to the first major surface, the first major surface forming a light extraction face, the first major surface having a rough surface including a convex part and a concave part, and the first semiconductor layer made of a nitride semiconductor crystal;
a light emitting layer having an active layer and provided on the second major surface;
a second semiconductor layer provided on the light emitting layer; and
a low refractive index layer in contact with the concave part, the low refractive index layer not covering the convex part, the low refractive index layer made of a nitride semiconductor crystal, and the low refractive index layer having a refractive index lower than the refractive index of the first semiconductor layer,
wherein:
the nitride semiconductor crystal of the low refractive index layer comprises Al with a first composition ratio of Al to Group III elements, and the nitride semiconductor crystal of the first semiconductor layer comprises Al with a second composition ratio of Al to Group III elements lower than the first composition ratio, or
the nitride semiconductor crystal of the low refractive index layer comprises Al, and the nitride semiconductor crystal of the first semiconductor layer does not comprise Al;

the low refractive index layer has a first face and a second face, the first face being arranged between the second face and the light emitting layer; and a distance between the second face and the light emitting layer is larger than a distance between the convex part and the light emitting layer.

2. The device according to claim 1, further comprising a transparent conductive film covering the convex part and the second face.

3. A semiconductor light emitting device comprising:
a first semiconductor layer having a first major surface and a second major surface opposite to the first major surface, the first major surface forming a light extraction face, the first major surface having a rough surface including a convex part and a concave part, and the first semiconductor layer made of a nitride semiconductor crystal;
a light emitting layer having an active layer and provided on the second major surface;
a second semiconductor layer provided on the light emitting layer;
a low refractive index layer in contact with the concave part, the low refractive index layer not covering the convex part, the low refractive index layer made of a nitride semiconductor crystal, and the low refractive index layer having a refractive index lower than the refractive index of the first semiconductor layer; and
a transparent conductive film provided such that the first semiconductor layer and the low refractive index layer are positioned between the transparent conductive film and the light emitting layer,
wherein:
the nitride semiconductor crystal of the low refractive index layer comprises Al with a first composition ratio of Al to Group III elements, and the nitride semiconductor crystal of the first semiconductor layer comprises Al with a second composition ratio of Al to Group III elements lower than the first composition ratio, or
the nitride semiconductor crystal of the low refractive index layer comprises Al, and the nitride semiconductor crystal of the first semiconductor layer does not comprise Al;
the low refractive index layer has a first face and a second face, the first face being arranged between the second face and the light emitting layer; and
a distance between the second face and the light emitting layer is not less than a distance between the convex part and the light emitting layer.

4. The device according to claim 1, wherein a lattice of the low refractive index layer is continuous with a lattice of the first semiconductor layer.

5. The device according to claim 1, wherein the concave part is epitaxially grown on the low refractive index layer starting from the low refractive index layer so that the first semiconductor layer is formed as an integrated film.

6. A wafer, comprising:
a substrate;
a semiconductor layer having a first major surface and a second major surface opposite to the first major surface, the first major surface having a rough surface including a convex part and a concave part, and the semiconductor layer made of a nitride semiconductor crystal; and
a low refractive index layer in contact with the concave part, the low refractive index layer not covering the convex part, the low refractive index layer made of a nitride semiconductor crystal, and the low refractive index layer having a refractive index lower than the refractive index of the semiconductor layer,
wherein:
the nitride semiconductor crystal of the low refractive index layer comprises Al with a first composition ratio of Al to Group III elements, and the nitride semiconductor crystal of the semiconductor layer comprises Al with a second composition ratio of Al to Group III elements lower than the first composition ratio, or
the nitride semiconductor crystal of the low refractive index layer comprises Al, and the nitride semiconductor crystal of the semiconductor layer does not comprise Al;
the low refractive index layer has a first face and a second face, the first face being arranged between the second face and the second major surface; and
a distance between the second face and the second major surface is larger than a distance between the convex part and the second major surface.

7. The wafer according to claim 6, wherein the concave part is epitaxially grown on the low refractive index layer starting from the low refractive index layer so that the semiconductor layer is formed as an integrated film.

8. The wafer according to claim 6, wherein a lattice of the low refractive index layer is continuous with a lattice of the semiconductor layer.

9. The device according to claim 1, wherein the convex part and the concave part are made of the same nitride semiconductor crystal.

10. The device according to claim 1, wherein the first semiconductor layer is made of an n-type GaN, and the low refractive index layer is made of AlGaN.

11. The device according to claim 1, wherein at least a part of a light emitted from the light emitting layer is extracted outside the device through at least one of the light extraction face and the low refractive index layer.

12. The wafer according to claim 6, wherein a composition of the convex part is same as a composition of the concave part.

13. The wafer according to claim 6, wherein the first semiconductor layer is made of an n-type GaN, and the low refractive index layer is made of AlGaN.

14. A semiconductor light emitting device, comprising:
a first semiconductor layer having a first major surface and a second major surface opposite to the first major surface, the first major surface forming a light extraction face, the first major surface having a rough surface including a convex part and a concave part, and the first semiconductor layer made of a nitride semiconductor crystal;
a light emitting layer having an active layer and provided on the second major surface;
a second semiconductor layer provided on the light emitting layer; and
a low refractive index layer in contact with the concave part, the low refractive index layer not covering the convex part, the low refractive index layer made of a nitride semiconductor crystal, and the low refractive index layer having a refractive index lower than the refractive index of the first semiconductor layer,
wherein:
the nitride semiconductor crystal of the low refractive index layer comprises Al with a first composition ratio of Al to Group III elements, and the nitride semiconductor crystal of the first semiconductor layer comprises Al with a second composition ratio of Al to Group III elements lower than the first composition ratio, or the nitride semiconductor crystal of the low refractive index layer comprises Al, and the nitride semiconductor crystal of the first semiconductor layer does not comprise Al;

the low refractive index layer has a pillar shape having a first face and a second face, the first face being arranged between the second face and the light emitting layer; and a distance between the second face and the light emitting layer is larger than a distance between the convex part and the light emitting layer.

15. A semiconductor light emitting device, comprising:

a first semiconductor layer having a first major surface and a second major surface opposite to the first major surface, the first major surface forming a light extraction face, the first major surface having a rough surface including a convex part and a concave part, and the first semiconductor layer made of a nitride semiconductor crystal;

a light emitting layer having an active layer and provided on the second major surface;

a second semiconductor layer provided on the light emitting layer; and a low refractive index layer in contact with the concave part, the low refractive index layer not covering the convex part, the low refractive index layer made of a nitride semiconductor crystal, and the low refractive index layer having a refractive index lower than the refractive index of the first semiconductor layer, wherein:

the nitride semiconductor crystal of the low refractive index layer comprises Al and Ga with a first composition ratio of Al to Ga, and the nitride semiconductor crystal of the first semiconductor layer comprises Al and Ga with a second composition ratio of Al to Ga lower than the first composition ratio, or the nitride semiconductor crystal of the low refractive index layer comprises Al and Ga, and the nitride semiconductor crystal of the first semiconductor layer does not comprise Al;

the low refractive index layer has a first face and a second face, the first face being arranged between the second face and the light emitting layer; and a distance between the second face and the light emitting layer is larger than a distance between the convex part and the light emitting layer.

* * * * *